United States Patent
Regier et al.

(10) Patent No.: US 10,175,334 B2
(45) Date of Patent: Jan. 8, 2019

(54) SELF-CALIBRATION OF SOURCE-MEASURE UNIT VIA CAPACITOR

(71) Applicant: NATIONAL INSTRUMENTS CORPORATION, Austin, TX (US)

(72) Inventors: Christopher G. Regier, Cedar Park, TX (US); Pablo Limon, Cedar Park, TX (US)

(73) Assignee: NATIONAL INSTRUMENTS CORPORATION, Austin, TX (US)

( * ) Notice: Subject to any disclaimer, the term of this patent is extended or adjusted under 35 U.S.C. 154(b) by 1162 days.

(21) Appl. No.: 14/105,999

(22) Filed: Dec. 13, 2013

(65) Prior Publication Data

US 2015/0168529 A1 Jun. 18, 2015

(51) Int. Cl.
*G01R 35/00* (2006.01)
(52) U.S. Cl.
CPC .................................. *G01R 35/005* (2013.01)
(58) Field of Classification Search
CPC combination set(s) only.
See application file for complete search history.

(56) References Cited

U.S. PATENT DOCUMENTS

| 7,903,008 B2 | 3/2011 | Regier |
| 8,456,338 B2 | 6/2013 | Regier |
| 2014/0145729 A1 | 5/2014 | Sobolewski |

FOREIGN PATENT DOCUMENTS

| CN | 203241529 U | 10/2013 | |
| JP | WO 2015182741 A1 * | 12/2015 | ............. G01R 35/00 |

* cited by examiner

*Primary Examiner* — Minh Q Phan
(74) *Attorney, Agent, or Firm* — Meyertons Hood Kivlin Kowert & Goetzel, P.C.; Jeffrey C. Hood

(57) ABSTRACT

Systems and methods for calibration and operation of a source-measure unit (SMU). The system may include a functional unit and output terminals coupled to the functional unit. An excitation signal may be applied to a capacitor by the SMU. The capacitor may be included in a calibration circuit. The method may include obtaining one or more of a current calibration coefficient (CCC) or a voltage calibration coefficient (VCC). The CCC may correspond to a current-range setting and the VCC may correspond to a voltage-range setting. The CCC may be obtained from a value of a first current and a value of a second current developed in the capacitor responsive to the excitation signal. The VCC may be obtained from a value of a first voltage and a value of a second voltage developed across the capacitor responsive to the excitation signal.

20 Claims, 6 Drawing Sheets

SELF-CALIBRATION OF SOURCE-MEASURE UNIT VIA CAPACITOR

FIELD OF THE INVENTION

The present invention relates generally to measurement and data acquisition systems and, more particularly, to the calibration and operation of source-measure units.

DESCRIPTION OF THE RELATED ART

Scientists and engineers often use measurement systems to perform a variety of functions, including measurement of a physical phenomenon, a unit under test (UUT) or device under test (DUT), test and analysis of physical phenomena, process monitoring and control, control of mechanical or electrical machinery, data logging, laboratory research, and analytical chemistry, to name a few examples.

A typical measurement system comprises a computer system, which commonly features a measurement device, or measurement hardware. The measurement device may be a computer-based instrument, a data acquisition device or board, a programmable logic device (PLD), an actuator, or other type of device for acquiring or generating data. The measurement device may be a card or board plugged into one of the I/O slots of the computer system, or a card or board plugged into a chassis, or an external device. For example, in a common measurement system configuration, the measurement hardware is coupled to the computer system through a PCI bus, PXI (PCI extensions for Instrumentation) bus, a GPIB (General-Purpose Interface Bus), a VXI (VME extensions for Instrumentation) bus, a serial port, parallel port, or Ethernet port of the computer system. Optionally, the measurement system includes signal-conditioning devices, which receive field signals and condition the signals to be acquired.

A measurement system may typically include transducers, sensors, or other detecting means for providing "field" electrical signals representing a process, physical phenomena, equipment being monitored or measured, etc. The field signals are provided to the measurement hardware. In addition, a measurement system may also typically include actuators for generating output signals for stimulating a DUT.

Measurement systems, which may also be generally referred to as data acquisition systems, may include the process of converting a physical phenomenon (such as temperature or pressure) into an electrical signal and measuring the signal in order to extract information. PC-based measurement and data acquisition (DAQ) systems and plug-in boards are used in a wide range of applications in the laboratory, in the field, and on the manufacturing plant floor, among others. Typically, in a measurement or data acquisition process, analog signals are received by a digitizer, which may reside in a DAQ device or instrumentation device. The analog signals may be received from a sensor, converted to digital data (possibly after being conditioned) by an Analog-to-Digital Converter (ADC), and transmitted to a computer system for storage and/or analysis. Then, the computer system may generate digital signals that are provided to one or more digital to analog converters (DACs) in the DAQ device. The DACs may convert the digital signal to an output analog signal that is used, e.g., to stimulate a DUT.

Multifunction DAQ devices typically include digital I/O capabilities in addition to the analog capabilities described above. Digital I/O applications may include monitoring and control applications, video testing, chip verification, and pattern recognition, among others. DAQ devices may include one or more general-purpose, bidirectional digital I/O lines to transmit and received digital signals to implement one or more digital I/O applications. DAQ devices may also include a Source-Measure Unit (SMU), which may apply a voltage to a DUT and measure the resulting current, or may apply a current to the DUT and measure the resulting voltage. SMUs are typically configured to operate according to what is commonly referred to as "compliance limits", to limit the output current when sourcing voltage, and limit the output voltage when sourcing current. In other words, a compliance limit on the measured signal may determine the (maximum) value of the sourced signal. For example, when applying a source voltage to a DUT and measuring current, a given current value (e.g. 1 A) specified as the compliance limit would determine the (maximum) input (source) voltage that might be provided to the DUT. In most cases compliance limits may depend and/or may be determined based on the DUTs, e.g. the maximum (absolute) value of the current that may flow into the DUT, or the maximum (absolute) value of the voltage that may be applied across the terminals of the DUT.

In the case of most SMUs, the setpoint (the desired output voltage when sourcing and regulating voltage, or the desired current value when sourcing and regulating current) and the compliance limits are typically programmable. SMUs are available to cover a variety of signal levels, from the microvolt ($\mu$V) range to the kilovolt (kV) range, and from the femtoampere (fA) range to the ampere (A) range. Some SMUs can deliver or dissipate significant power, while other SMUs may be operated at low power. The accuracy of SMUs is typically less than the accuracy of high-quality calibrators and/or digital multi meters (DMMs).

Furthermore, some SMUs may rely on self-calibration to ensure the long-term accuracy of the unit. Self-calibration may allow for the removal of stability requirements for most of the circuitry of the SMU. Thus, instead of the majority of circuitry of the SMU requiring strict stability, with self-calibration, a small number of components may be required to meet strict stability requirements. For example, instead of requiring an entire voltage measurement path to be stable over a long-term, only a single voltage reference must be stable. Note, however, that a typical SMU may have multiple ranges of operation, or operating ranges, and each may require its own reference or a method to transfer calibration from one operating range to another. In such instances, the self-calibration circuitry may become expensive and complex if the SMU includes many operating ranges or if the operating ranges span a large dynamic range.

For example, a prior art SMU may have voltage operating ranges, e.g., voltage-range settings, of 1 volt (V) and 10V and current operating ranges, e.g., current-range settings, of 10 micro-ampere ($\mu$A), 100 $\mu$A, 1 mili-ampere (mA), 10 mA, and 100 mA. Assume the 10V operating range may be self-calibrated by measuring a known, stable 5V voltage reference. Thus, the 1V range may be calibrated by measuring an impedance, voltage (V) divided by current (I) (V/I), while using the 10V/1 mA operating range combination followed measuring the impedance while operating in the 1V/1 mA operating range combination. Since the 10V operating range has been calibrated, the difference in the measurement of the impedance for each operating range combination would be due to mis-calibration of the 1V operating range, which could then be corrected. Note, the measured impedance may be a resistor with a known and stable impedance, e.g., a 1 kilo-ohm (k$\Omega$) as known in the art. However, the 1 kΩ resistor may yield poor results when calibrating the 10 μA operating range because only 10 mili-volts (mV), or 1% of the full-scale range of the 1V operating range, would be required to achieve full-scale current on the 10 μA operating range. Thus, for a proper self-calibration, multiple resistors may be required. Additionally, switching between the resistors may be complicated by the need to avoid introducing errors from the switch resistance.

Other corresponding issues related to the prior art will become apparent to one skilled in the art after comparing such prior art with the present invention as described herein.

SUMMARY OF THE INVENTION

Various embodiments of a system and method for calibration and operation of a source-measure unit (SMU) are presented below. A system for calibration and operation of the SMU may include a functional unit, output terminals, coupled to the functional unit, and a capacitor, selectively coupled to the functional unit in place of the output terminals. In certain embodiments the capacitor may be included in a calibration circuit. The calibration circuit may include switches configured to couple the capacitor to the functional unit in place of the output terminals. Additionally, in certain embodiments, the system may include additional functional units, e.g., one or more, or a plurality. Further, the system may be included in, or installed in, a chassis. Accordingly, the functional unit, or one or more functional units, may be configured to perform the methods detailed below. Further, a non-transient computer memory medium may be configured to store program instructions executable by the functional unit, one or more functional units, or a plurality of functional units to perform the methods detail below.

In an exemplary embodiment, a method for calibrating and operating the SMU may include applying an excitation signal by the SMU to a capacitor and obtaining one or more of a current calibration coefficient (CCC) or a voltage calibration coefficient (VCC). The CCC may correspond to a current-range setting of the SMU. The VCC may correspond to a voltage-range setting of the SMU.

Obtaining the CCC may include determining a value of a first current that may be developed in a capacitor responsive to the excitation signal and a value of a second current that may be developed in the capacitor responsive to the excitation signal. The CCC may be determined from the value of the first current and the value of the second current.

Obtaining the VCC may include determining a value of a first voltage that may be developed across the capacitor responsive to the excitation signal and a value of a second voltage that may be developed across the capacitor responsive to the excitation signal. The VCC may be determined from the value of the first voltage and the value of the second voltage.

In some embodiments, obtaining the CCC may further include applying an excitation signal that may have an amplitude to the capacitor. In such embodiments, the first current and the second current may be developed in the capacitor responsive to the excitation signal. In such embodiments, obtaining the VCC may further include applying the excitation signal to the capacitor. The first voltage and the second voltage may be developed across the capacitor responsive to the excitation signal.

Further, in certain embodiments, determining the value of the first current and determining the value of the first voltage may each include operating the SMU with a first current-range setting and a first voltage-range setting. In such embodiments, determining the value of the second current may include operating the SMU with a second current-range setting and the first voltage-range setting. Additionally, determining the value of the second voltage may include operating the SMU with the first current-range setting and a second voltage-range setting.

In an exemplary embodiment, the amplitude may be a reference voltage. Additionally, in some embodiments, the excitation signal may be a first excitation signal. Further, the first excitation signal may have a first operating frequency and the amplitude may be a first amplitude.

In other embodiments, the CCC may be a first CCC and the VCC may be a first VCC. In such embodiments, the method may further include obtaining one or more of a second CCC or a second VCC. The second CCC may correspond to a third current-range setting of the SMU. The second VCC may correspond to a third voltage-range setting of the SMU.

In such embodiments, obtaining the second CCC may include applying a second excitation signal to the capacitor. The second excitation signal may have a second operating frequency and a third current and a fourth current may be developed in the capacitor responsive to the second excitation signal. Additionally, a value of the third current developed in the capacitor and a value of the fourth current developed in the capacitor may be determined and the second CCC may be determined from the value of the third current and the value of the fourth current.

Additionally, in such embodiments, obtaining the second VCC may include applying the second excitation signal to the capacitor and a third voltage and a fourth voltage may be developed across the capacitor responsive to the second excitation signal. Further, a value of the third voltage developed across the capacitor and a value of the fourth voltage developed across the capacitor may be determined and the second VCC may be determined from the value of the third voltage and the value of the fourth voltage.

Accordingly, in certain embodiments, determining the value of the third current and determining the value of the third voltage each may include operating the SMU with the first current-range setting and the first voltage-range setting. In such embodiments, determining the value of the fourth current may include operating the SMU with the third current-range setting and the first voltage-range setting and determining the value of the fourth voltage may include operating the SMU with the first current-range setting and the third voltage-range setting.

In some embodiments, the second excitation signal may have a second amplitude. In other embodiments, the excitation signal may be a trapezoidal waveform. In one embodiment, the operating frequency of the excitation signal may be specified to maximize a signal-to-noise ratio.

In one embodiment, the determining the CCC may further include determining the CCC based on a first characteristic of the capacitor corresponding to the value of the first current and a second characteristic of the capacitor corresponding to the value of the second current. Accordingly, determining the VCC may further include determining the VCC based on a third characteristic of the capacitor corresponding to the value of the first voltage and a fourth characteristic of the capacitor corresponding to the value of the second voltage. In such embodiments, the characteristic of the capacitor may be one of an impedance, a reactance, or a capacitance.

In an exemplary embodiment, the capacitor may have an impedance and the method may further include determining the impedance of the capacitor for a specified excitation frequency. Further, in certain embodiments, the capacitor may include a plurality of impedances based on operating frequency of the excitation signal and the method may further include determining one or more impedances corresponding to one or more excitation frequencies. In such embodiments, the method may also include weighting each of the one or more impedances to offset the corresponding apparent series loss in the circuit at each of the one or more excitation frequencies.

In another embodiment, the excitation may have an amplitude and an operating frequency and determining the CCC may further include determining the CCC based on a known characteristic of the capacitor and the value of the first and second currents. Similarly, determining the VCC may further include determining the VCC based on the known characteristic of the capacitor and the value of the first and second voltages. In such embodiments, the known characteristic of the capacitor may be based on the operating frequency of the excitation signal. In certain embodiments, the known characteristic may include one of an impedance, a reactance, or a capacitance and the method may further include determining the known characteristic of the capacitor for a specified excitation signal where the specified excitation signal has an operating frequency.

In another exemplary embodiment, a method for calibrating an SMU may include operating the SMU with a first current-range setting and a first voltage-range setting and operating the SMU with a second current-range setting and a second voltage-range setting. Operating the SMU with the first current-range setting and first voltage-range setting may include applying an excitation to a calibration circuit. In one embodiment, the calibration circuit may include a capacitor. In one embodiment, a value of a first impedance of the calibration circuit may be determined responsive to the excitation signal.

In certain embodiments, the excitation signal may include an amplitude. Additionally, the excitation signal may include an operating frequency. The excitation signal may be one of a plurality of excitation signals. In such embodiments, each of the plurality, or one or more, excitation signals may include a corresponding or associated amplitude and a corresponding or associated operating frequency.

Operating the SMU with the second current-range setting and the second voltage-range setting may include applying the excitation signal to the calibration circuit. In one embodiment, a value of a second impedance of the calibration circuit may be determined responsive to the excitation signal.

Additionally, a calibration coefficient corresponding to the second current-range setting and second voltage-range setting of the SMU may be determined. In one embodiment, the calibration coefficient may be determined from the value of the first impedance and the value of the second impedance.

In yet another exemplary embodiment, a method for calibrating and operating a source-measure unit (SMU), may include applying an excitation signal by the SMU to a capacitor. The excitation signal may have an amplitude and operating frequency. In certain embodiments, the excitation signal may have a trapezoidal waveform. In such embodiments, the operating frequency of the excitation signal may be the fundamental frequency of the trapezoidal waveform. In certain embodiments, the amplitude and operating frequency of the excitation signal may be specified to maximize a signal-to-noise ratio.

Responsive to the excitation signal, a current may developed in the capacitor and voltage may be developed across the capacitor. Accordingly, a value of the current and a value of the voltage may be determined. Further, one or more of a current calibration coefficient (CCC) or a voltage calibration coefficient (VCC) may be obtained. The CCC may correspond to a current-range setting of the SMU and may be determined from the value of the current, the value of the voltage, and a known characteristic of the capacitor. Similarly, the VCC may correspond to a voltage-range setting of the SMU and may be determined from the value of the voltage, the value of the current, and the known characteristic of the capacitor.

In one embodiment of the method, the known characteristic of the capacitor may be one of an impedance, a reactance, or a capacitance. In certain embodiments, the capacitor may have one or more known characteristics that may correspond to one or more frequencies of the excitation signal. In such embodiments, the method may further include weighting each of the one or more known characteristics to offset a corresponding one or more apparent series losses in the circuit. Note, the one or more apparent series losses may be a function of the one or more frequencies of the excitation signal.

Further, in some embodiments, the method may also include determining the known characteristic of the capacitor for a specified excitation signal. Note, in such embodiments, the specified excitation signal may have an operating frequency.

BRIEF DESCRIPTION OF THE DRAWINGS

A better understanding of the present invention can be obtained when the following detailed description of the preferred embodiment is considered in conjunction with the following drawings, in which.

Figure 1:
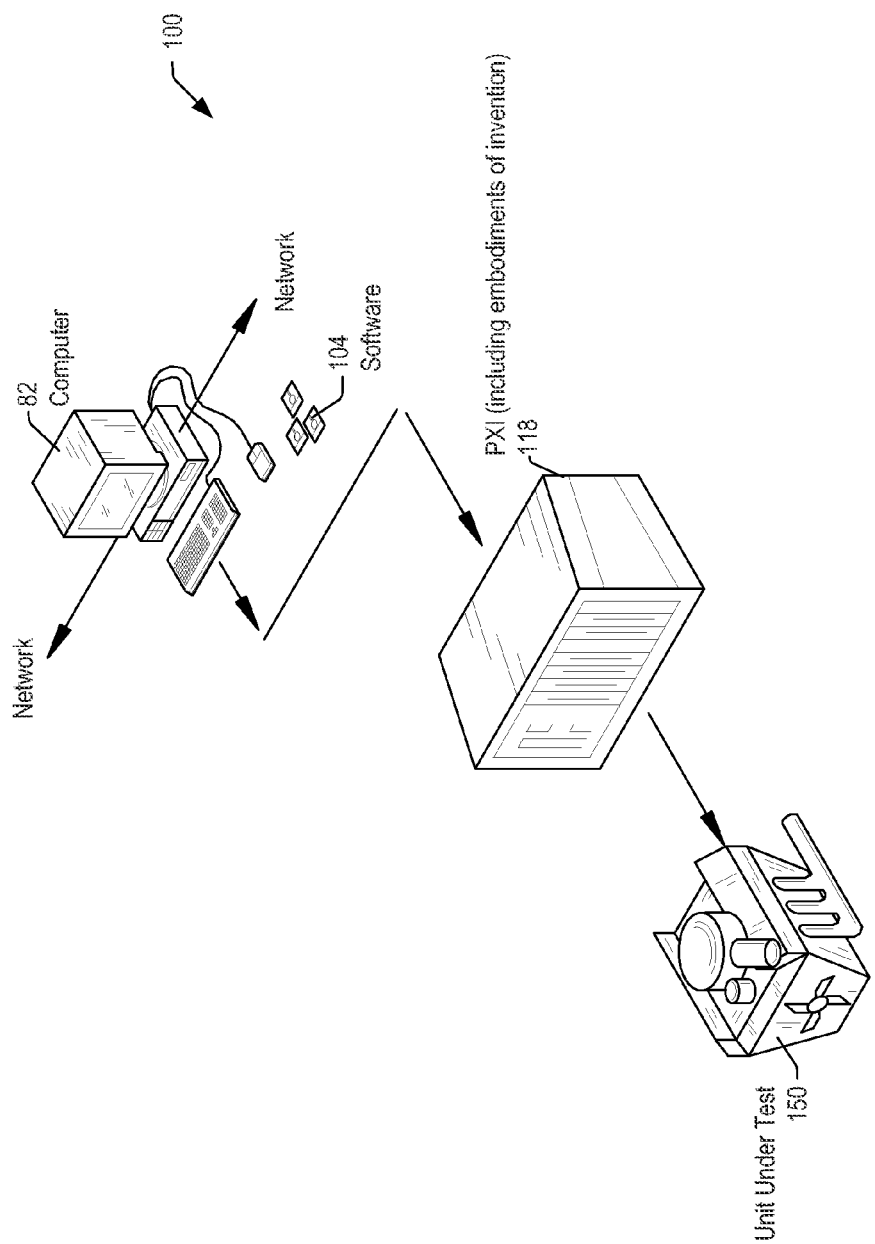
FIG. 1 illustrates an instrumentation system according to one embodiment of the invention.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Incorporation by Reference

The following reference is hereby incorporated by reference in its entirety as though fully and completely set forth herein:

U.S. Pat. No. 7,903,008 titled "Source-Measure Unit Based on Digital Control Loop," issued on Nov. 6, 2008.

Terms

The following is a glossary of terms used in the present application:

Memory Medium—Any of various types of non-transitory computer accessible memory devices or storage devices. The term "memory medium" is intended to include an installation medium, e.g., a CD-ROM, floppy disks 104, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. The memory medium may comprise other types of non-transitory memory as well or combinations thereof. In addition, the memory medium may be located in a first computer in which the programs are executed, or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as a physical transmission medium, such as a bus, network, and/or other physical transmission medium that conveys signals such as electrical, electromagnetic, or digital signals.

Programmable Hardware Element—includes various hardware devices comprising multiple programmable function blocks connected via a programmable interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic".

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, such as C, C++, PASCAL, FORTRAN, COBOL, JAVA, assembly language, etc.; graphical programs (programs written in graphical programming languages); assembly language programs; programs that have been compiled to machine language; scripts; and other types of executable software. A software program may comprise two or more software programs that interoperate in some manner. Note that various embodiments described herein may be implemented by a computer or software program. A software program may be stored as program instructions on a memory medium.

Hardware Configuration Program—a program, e.g., a netlist or bit file, that can be used to program or configure a programmable hardware element.

Program—the term "program" is intended to have the full breadth of its ordinary meaning. The term "program" includes 1) a software program which may be stored in a memory and is executable by a processor or 2) a hardware configuration program useable for configuring a programmable hardware element.

Graphical Program—A program comprising a plurality of interconnected nodes or icons, wherein the plurality of interconnected nodes or icons visually indicate functionality of the program. The interconnected nodes or icons are graphical source code for the program. Graphical function nodes may also be referred to as blocks.

The following provides examples of various aspects of graphical programs. The following examples and discussion are not intended to limit the above definition of graphical program, but rather provide examples of what the term "graphical program" encompasses:

The nodes in a graphical program may be connected in one or more of a data flow, control flow, and/or execution flow format. The nodes may also be connected in a "signal flow" format, which is a subset of data flow.

Exemplary graphical program development environments which may be used to create graphical programs include LabVIEW®, DasyLab™, DIADem™ and Matrixx/SystemBuild™ from National Instruments, Simulink® from the MathWorks, VEE™ from Agilent, WiT™ from Coreco, Vision Program Manager™ from PPT Vision, SoftWIRE™ from Measurement Computing, Sanscript™ from Northwoods Software, Khoros™ from Khoral Research, SnapMaster™ from HEM Data, VisSim™ from Visual Solutions, ObjectBench™ by SES (Scientific and Engineering Software), and VisiDAQ™ from Advantech, among others.

The term "graphical program" includes models or block diagrams created in graphical modeling environments, wherein the model or block diagram comprises interconnected blocks (i.e., nodes) or icons that visually indicate operation of the model or block diagram; exemplary graphical modeling environments include Simulink®, SystemBuild™, VisSim™, Hypersignal Block Diagram™, etc.

A graphical program may be represented in the memory of the computer system as data structures and/or program instructions. The graphical program, e.g., these data structures and/or program instructions, may be compiled or interpreted to produce machine language that accomplishes the desired method or process as shown in the graphical program.

Input data to a graphical program may be received from any of various sources, such as from a device, unit under test, a process being measured or controlled, another computer program, a database, or from a file. Also, a user may input data to a graphical program or virtual instrument using a graphical user interface, e.g., a front panel.

A graphical program may optionally have a GUI associated with the graphical program. In this case, the plurality of interconnected blocks or nodes are often referred to as the block diagram portion of the graphical program.

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Measurement Device—includes instruments, data acquisition devices, smart sensors, and any of various types of devices that are configured to acquire and/or store data. A measurement device may also optionally be further configured to analyze or process the acquired or stored data. Examples of a measurement device include an instrument, such as a traditional stand-alone "box" instrument, a computer-based instrument (instrument on a card) or external instrument, a data acquisition card, a device external to a computer that operates similarly to a data acquisition card, a smart sensor, one or more DAQ or measurement cards or modules in a chassis, an image acquisition device, such as an image acquisition (or machine vision) card (also called a video capture board) or smart camera, a motion control device, a robot having machine vision, and other similar types of devices. Exemplary "stand-alone" instruments include oscilloscopes, multimeters, signal analyzers, arbitrary waveform generators, spectroscopes, and similar measurement, test, or automation instruments.

A measurement device may be further configured to perform control functions, e.g., in response to analysis of the acquired or stored data. For example, the measurement device may send a control signal to an external system, such as a motion control system or to a sensor, in response to particular data. A measurement device may also be configured to perform automation functions, i.e., may receive and analyze data, and issue automation control signals in response.

Functional Unit (or Processing Element)—refers to various elements or combinations of elements. Processing elements include, for example, circuits such as an ASIC (Application Specific Integrated Circuit), portions or circuits of individual processor cores, entire processor cores, individual processors, programmable hardware devices such as a field programmable gate array (FPGA), and/or larger portions of systems that include multiple processors, as well as any combinations thereof.

Automatically—refers to an action or operation performed by a computer system (e.g., software executed by the computer system) or device (e.g., circuitry, programmable hardware elements, ASICs, etc.), without user input directly specifying or performing the action or operation. Thus the term "automatically" is in contrast to an operation being manually performed or specified by the user, where the user provides input to directly perform the operation. An automatic procedure may be initiated by input provided by the user, but the subsequent actions that are performed "automatically" are not specified by the user, i.e., are not performed "manually", where the user specifies each action to perform. For example, a user filling out an electronic form by selecting each field and providing input specifying information (e.g., by typing information, selecting check boxes, radio selections, etc.) is filling out the form manually, even though the computer system must update the form in response to the user actions. The form may be automatically filled out by the computer system where the computer system (e.g., software executing on the computer system) analyzes the fields of the form and fills in the form without any user input specifying the answers to the fields. As indicated above, the user may invoke the automatic filling of the form, but is not involved in the actual filling of the form (e.g., the user is not manually specifying answers to fields but rather they are being automatically completed). The present specification provides various examples of operations being automatically performed in response to actions the user has taken.

Concurrent—refers to parallel execution or performance, where tasks, processes, or programs are performed in an at least partially overlapping manner. For example, concurrency may be implemented using "strong" or strict parallelism, where tasks are performed (at least partially) in parallel on respective computational elements, or using "weak parallelism", where the tasks are performed in an interleaved manner, e.g., by time multiplexing of execution threads.

Operating Range—refers to the range of operation of the source-measure unit (SMU). Typically referred to as a single value which denotes the full-scale value of the range, e.g., 10V range refers to the operating voltage-range of 0-10V and 10 mA range refers to the operating current-range of 0-10 mA. Note, the operating range of the SMU may be expressed in terms of either a current-range (for example, 10 fA), a voltage-range (for example, 60 V), or both (60 V/10 fA).

Current-Range Setting—refers to the operating range of the SMU in terms of current. For example, an SMU may have current-range settings of 1 A, 100 mA, 10 mA, 1 mA, 100 µA, 10 µA, and 1 µA, among others. Further, current-range setting may by uni-polar or bi-polar. In other words, the current-range settings may designate a range of ±1 A or 0-1 A, ±100 mA or 0-100 mA, ±10 mA or 0-10 mA, ±1 mA or 0-1 mA, and so forth.

Voltage-Range Setting—refers to the operating range of the source-measure unit in terms of voltage. For example, an SMU may have voltage-range settings of 60V, 10V, 6V, 1V, and 200 mV, among others. Further, voltage-range settings may be uni-polar or bi-polar. In other words, the voltage-range settings may designate a range of ±60V or 0-60V, ±10V or 0-10V, ±6V or 0-6V, and so forth.

Calibration Coefficient—refers to a gain correction value associated with correcting the error in measurement, either voltage or current, of a signal. If the gain correction value is associated with a current, it may be referred to as a current calibration coefficient (CCC). If the gain correction value is associated with a voltage, it may be referred to as a voltage calibration coefficient (VCC). In general, each operating range of an SMU may have an associated calibration coefficient.

Excitation Signal—refers to an alternating current (A/C) signal that may be defined by an amplitude (voltage) and frequency.

FIG. 1—Exemplary Instrumentation System

FIG. 1 illustrates an exemplary instrumentation system 100 configured with embodiments of the present invention. Embodiments of the present invention may be involved with performing test and/or measurement functions; controlling and/or modeling instrumentation or industrial automation hardware; modeling and simulation functions, e.g., modeling or simulating a device or product being developed or tested, etc. However, it is noted that embodiments of the present invention can be used for a plethora of applications and is not limited to the above applications. In other words, applications discussed in the present description are exemplary only, and embodiments of the present invention may be used in any of various types of systems.

As shown in FIG. 1, the system 100 may include a host computer 82. The host computer 82 may be coupled to a network and include a display device and at least one memory medium on which one or more computer programs or software components, according to one embodiment of the present invention may be stored. For example, the memory medium may store one or more graphical programs which are executable to perform the methods described herein. Additionally, the memory medium may store a graphical programming development environment application used to create and/or execute such graphical programs. The memory medium may also store operating system software, as well as other software for operation of the computer system. Various embodiments further include receiving or storing instructions and/or data implemented in accordance with the foregoing description upon a carrier medium.

Further, the host computer 82 may include a central processing unit (CPU) and one or more input devices such as a mouse or keyboard as shown. The computer 82 may operate with the one or more instruments to analyze, measure or control a unit under test (UUT) 150, e.g., via execution of software 104.

The one or more instruments may include PXI instrument 118. PXI instrument 118 may include a source-measure unit (SMU) according to embodiments of the present invention. Alternatively, the SMU may be included in another type of chassis or may by a stand-alone, or independent, device. The computer system may couple to and operate with PXI instrument 118. PXI instrument 118 may be coupled to the UUT 150. The system 100 may be used in a data acquisition and control application or in a test and measurement application, among others. Additionally, PXI instrument 118 may couple to host computer 82 over a network, such as the Internet.

Figure 2:
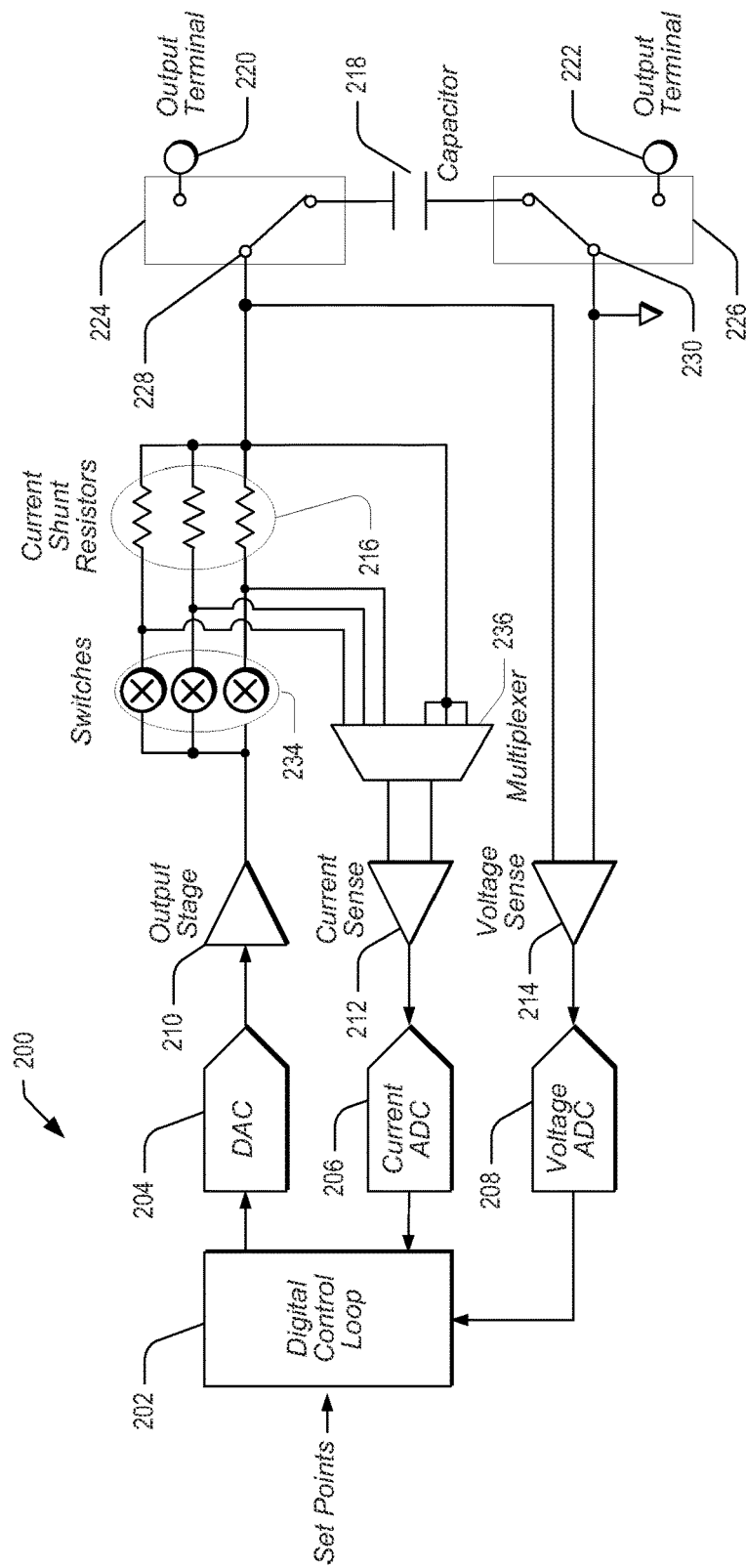
FIG. 2 is a block diagram of an exemplary system according to one embodiment of the invention.

FIG. 2—SMU Block Diagram

FIG. 2 is a block diagram of an exemplary system according to one embodiment of the invention. FIG. 2 illustrates the basic architecture of one embodiment of an SMU 200 in which the entire control loop has been configured in the digital domain. A device under test (DUT), not shown, may be coupled between output terminals 220 and 222. Setpoints and compliance limits may be provided (programmed) to Digital Control Loop (DCL) 202, which may provide a control output through DAC (digital-to-analog converter) 204 to Output Stage 210. Feedback from Output Stage 210 may be provided to Current ADC (analog-to-digital converter) 206 and Voltage ADC 208 via respective Current Sense element 212 and Voltage Sense element 214. As shown, different current shunt resistors 216 may be switched into the feedback loop between the output of Output Stage 210 and the inputs of Current Sense element 212, using a multiplexer 236 and a set of switches 234. Although FIG. 2 shows three switches (234) and three current shunt resistors (216), alternate embodiments may be configured with a greater or lesser number of switches and/or resistors, as desired. Shunt switching may provide the SMU with the capability to cover a wider dynamic range of current. Any glitches that may result from switching between the various current shunt resistors may be minimized by adjusting the settings of DAC 204 simultaneously with the shunt-switching operation. Since the current is being measured and the values of the current shunt resistors (216) are known, it is possible to calculate the value to which DAC 204 may be set to minimize potential glitches. Any errors in the calculations may eventually be corrected by DCL 202. Thus, Current ADC 206 and Voltage ADC 208 may then provide the readback current and voltage values into DCL 202. Additionally, SMU 200 may include a capacitor 218 which may be selectively switched into the circuit in place of the output terminals 220 and 222 during a self-calibration of the SMU 200.

Further, DCL 202 may include a functional unit. As used herein, the term functional unit refers to various elements or combinations of elements. Processing elements include, for example, circuits such as an ASIC (Application Specific Integrated Circuit), portions or circuits of individual processor cores, entire processor cores, individual processors, programmable hardware devices such as a field programmable gate array (FPGA), and/or larger portions of systems that include multiple processors, as well as any combinations thereof. In one embodiment, the functional unit may be configured to perform the methods described below. In certain embodiments, a memory medium may store the methods described below for execution on one or more processing units, such as the functional unit that may be included in DCL 202.

Thus, in certain embodiments, the functional unit may be configured to obtain one or more of a current calibration coefficient (CCC) corresponding to a first current-range of SMU 200 or a voltage calibration coefficient (VCC) corresponding to a first voltage-range of SMU 200. In order to obtain the CCC, the functional unit may be configured to determine a value of a first current developed in capacitor 218 and a value of a second current developed in capacitor 218. In certain embodiments, the first and second current may be developed in capacitor 218 responsive to an excitation signal that may be applied by SMU 200 to capacitor 218. Further, the functional unit may be configured to determine the CCC from the value of the first current and the value of the second current.

Accordingly, in order to obtain the VCC, the functional unit may be configured to determine a value of a first voltage developed across the capacitor 218 and a value of a second voltage developed across the capacitor 218. In certain embodiments, the first and second voltage may be developed across capacitor 218 responsive to an excitation signal that may be applied by SMU 200 to capacitor 218. Additionally, the functional unit may be configured to determine the VCC from the value of the first voltage and the value of the second voltage.

As noted above, in one embodiment, obtaining the CCC may also include applying an excitation signal to the capacitor 218. Accordingly, the first current and the second current may be developed in the capacitor in response to the excitation signal. Note, the term excitation signal is used to refer to an alternating current (A/C) signal that may be defined by an amplitude (voltage) and operating frequency. Thus, in some embodiments, the excitation signal may have an amplitude. The amplitude of the excitation signal may be expressed in terms of a voltage level. Thus, for example, an excitation signal may have a 1 V amplitude or a 5 V amplitude, among others. In certain embodiments, the amplitude may be precisely known. In other words, the source of the excitation signal may include a known and stable voltage source. Further, the excitation signal may also have an operating frequency. The operating frequency may be expressed in hertz (Hz). Thus, the excitation signal may be specified by both an amplitude and an operating frequency. In certain embodiments, the excitation signal may be a trapezoidal waveform. In such embodiments, the excitation signal may be expressed as a series of sinusoidal waveforms, each defined by a frequency. Thus the excitation signal may have more than one frequency. In such embodiments, the operating frequency of the excitation signal may be expressed in terms of the fundamental frequency of the trapezoidal waveform. In other embodiments, the excitation frequency may be specified in order to maximize the signal-to-noise ratio (SNR) of the signal. In an exemplary embodiment, the excitation signal may be one of a plurality of excitation signals. Thus, each excitation signal of the plurality of excitation signals may be specified by an amplitude and an operating frequency.

For example, a first excitation signal may include a first amplitude and a first operating frequency. Accordingly, a second excitation signal may include a second amplitude and a second operating frequency. Note, in some embodiments, one or more excitation signals may include equivalent amplitudes but have different operating frequencies. Similarly, one or more excitation signals may include equivalent operating frequencies but have different amplitudes. Thus, in some embodiments, the first and second amplitudes may be equivalent, whereas, in other embodiments, the first and second operating frequencies may be equivalent.

In another embodiment, obtaining the VCC may also include applying an excitation signal to the capacitor 218. Accordingly, the first voltage and the second voltage may be developed across the capacitor in response to the excitation signal.

In an exemplary embodiment, self-calibration may include operating the SMU 200 at multiple, e.g., one or more, or a plurality of, current-range settings and voltage-range settings. In such embodiments, in order to determine a CCC for a particular current-range setting, a first current-range may have been calibrated using a known prior art method, e.g., for example, via a reference resistor with a known and stable impedance. Similarly, in order to determine a VCC for a particular voltage-range setting, a first voltage-range setting may have been calibrated using a known prior art method, e.g., for example, via a reference voltage from a known and stable source.

Thus, the SMU 200 may be operated in a first current-range setting and a first voltage-range setting in order to determine the value of the first current and the value of the first voltage. Accordingly, the SMU 200 may be operated in a second current-range setting and the first voltage-range setting in order to determine the value of the second current. Similarly, the SMU 200 may be operating in the first current-range setting and a second voltage-range setting in order to determine the value of the second voltage.

For example, a 6V range of an SMU, such as SMU 200, may be calibrated using a known 5V voltage reference. In other words, a first voltage-range setting may be calibrated using a reference voltage. Further, a 100 µA to range of an SMU, such as SMU 200, may be calibrated using the voltage reference and a known reference resistor, e.g., a resistor with a known and stable impedance. In other words, a first current-range setting may be calibrated using a reference voltage and a reference resistor. Accordingly, a 600 mV range may then be calibrated based on the 6V range and 100 µA to range. In other words, a second voltage-range setting may be calibrated based on the first voltage-range setting and first current-range setting. Similarly, a 1 mA range may then be calibrated based on the 6V range and 100 µA to range. In other words, a second current-range setting may be calibrated based on the first voltage-range setting and first current-range setting.

Continuing the example, the value of the first current and the value of the first voltage may be determined by operating the SMU 200 with the 6 V/100 µA to range setting and applying an excitation signal to the capacitor 218. The value of the second voltage may be determined by operating the SMU 200 with the 600 mv/100 µA to range setting and applying the excitation signal to the capacitor 218. The value of the second current may be determined by operating the SMU 200 with the 6 V/1 mA range setting and applying the excitation signal to the capacitor 218. Further, the excitation signal may be a first excitation signal and may include a first operating frequency and first amplitude. Note, in order to calibrate, e.g., obtain calibration coefficients for, other voltage-range settings and current-range settings may require other excitation signals that may include other amplitudes and operating frequencies. Thus, a plurality of CCCs and VCCs may be determined.

In certain embodiments, the capacitor 218 may have an impedance, such as 1 kilo-ohm (1 kΩ). However, the impedance of the capacitor 218 may be dependent upon the operating frequency of the excitation signal. Thus, the impedance of the capacitor for a specified excitation frequency may be determined. In other embodiments, one or more impedances corresponding to one or more operating, or excitation, frequencies may be determined. Thus the capacitor 218 may have a plurality of impedances based on excitation frequency. Further, in some embodiments, each of the one or more impedances of the capacitor 218 may be weighted to offset the corresponding apparent series loss in the circuit at each of the one or more excitation frequencies In certain embodiments, capacitor 218 may have a capacitance that is substantially constant with frequency. In other words, the capacitance may be stable, or assumed to not change, with frequency. In such embodiments, other characteristics of the capacitor may change proportionally with frequency. For example, the impedance, and more specifically the reactance of capacitor 218 may decrease in proportion to the operating frequency of the excitation signal. Thus, in certain embodiments, the calibration coefficients, e.g., the CCC and VCC, may be determined from the one of the reactance or capacitance of capacitor 218.

For example, in an embodiment where excitation signal may apply a voltage to the capacitor, only current in quadrature to the applied voltage at a given frequency may be used to determine the CCC. Thus, any current in phase with the applied voltage may be ignored because it may be due to parasitic resistance and, therefore, not dependable. Thus, as a further example, assume an excitation signal with a trapezoidal waveform may be applied to capacitor 218. Then, the voltage across capacitor 218 and the current in capacitor 218 may be determined by voltage ADC 208 and current ADC 206, respectively. Accordingly, a Fast Fourier Transform (FFT) may be performed to extract a magnitude and phase of the voltage and current at the fundamental frequency, e.g., operating frequency, of the trapezoidal waveform. Further, in certain embodiments, the FFT may be performed to extract magnitude and phase of the voltage and current at one or more harmonics of the trapezoidal waveform. Thus, dividing the determined voltage by the current may determine the total measured impedance of the capacitor at the specified frequency. Accordingly, the imaginary part of this complex number may be the measured reactance of the capacitor. Thus, the apparent change in this reactance when switching ranges may be used to determine the CCC or VCC. Additionally, by using the reactance (or the linearly-related capacitance) sensitivity to resistances in the circuit, such as the values of the current-range-setting shunt resistors 216 may be removed, since resistances impact only the real part of the measured impedance.

In another exemplary embodiment, an excitation signal may be applied to capacitor 218 by SMU 200. In such embodiments, a value of a current developed in capacitor 218 responsive to the excitation signal may be determined. Further, a value of a voltage developed across capacitor 218 responsive to the excitation signal may be determined. Then, one or more of a CCC or a VCC may be obtained. The CCC may correspond to a current-range setting of SMU 200 and may be determined from the value of the current, the value of the voltage, and a known characteristic of capacitor 218. Similarly, the VCC may correspond to a voltage-range setting of SMU 200 and may be determined from the value of the voltage, the value of the current, and the known characteristic of capacitor 218.

In one embodiment, the known characteristic of capacitor 218 may be one of a capacitance, an impedance, or a reactance. The term known characteristic refers to a quantifiable characteristic that may be considered stable for the useful life of the capacitor. Thus, in one embodiment, the capacitor may be characterized over one or more operating frequencies. In other words, the known characteristic may change in proportion to operating frequency of an excitation signal and the known characteristic may be determined for one or more specified operating frequencies.

Figure 3:
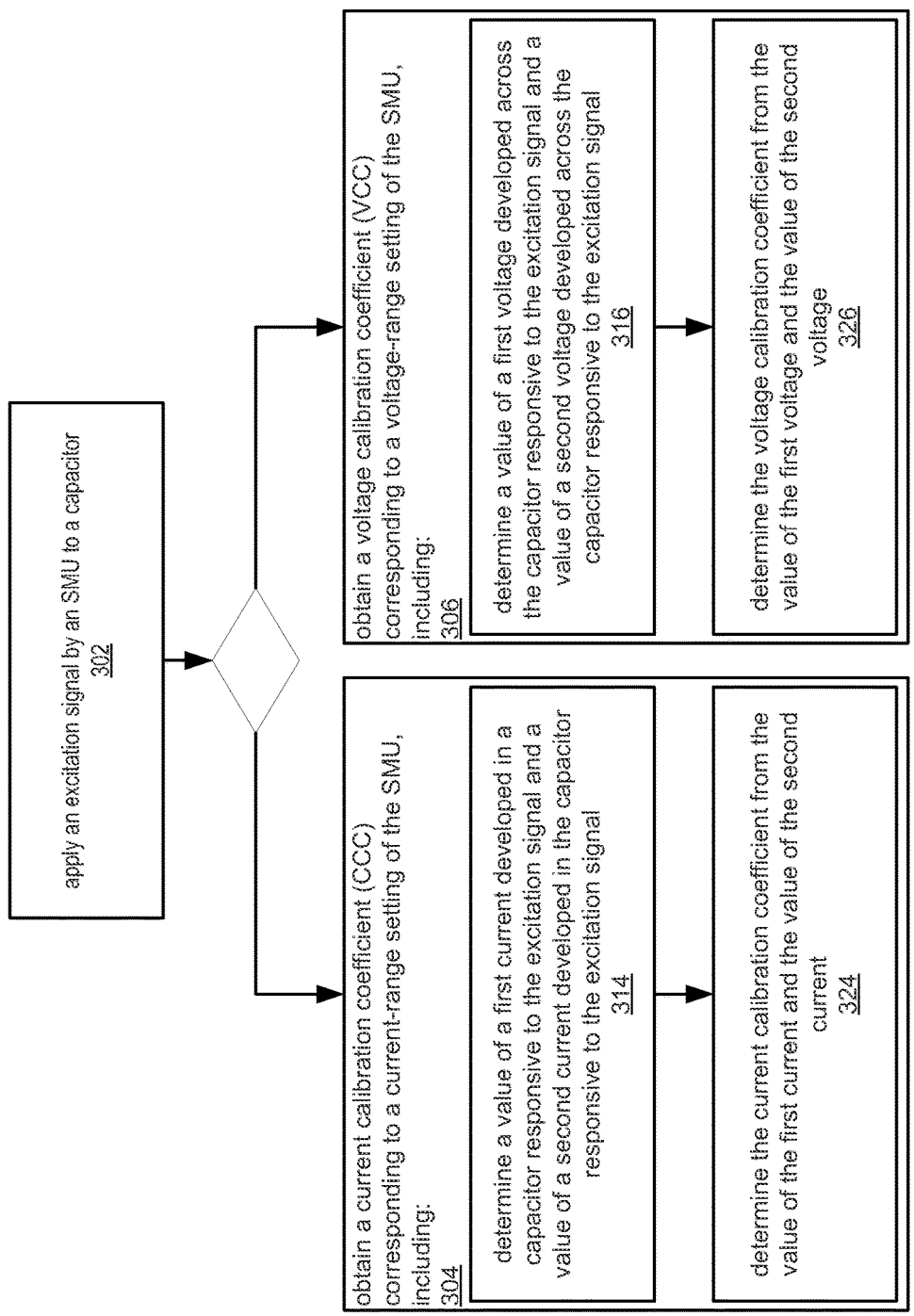
FIG. 3 is a flowchart diagram illustrating one embodiment of a method for self-calibrating an SMU.

FIG. 3—Flowchart of a Method for Calibrating and Operating an SMU

FIG. 3 illustrates a method for calibrating and operating a source-measure unit (SMU). The method shown in FIG. 3 may be used in conjunction with any of the computer systems or devices shown in the above Figures, among other devices. Further, a non-transient computer memory medium may be configured to store program instructions executable by one or more functional units to perform the method. In various embodiments, some of the method elements shown may be performed concurrently, in a different order than shown, or may be omitted. Additional method elements may also be performed as desired. As shown, this method may operate as follows.

In 302, an excitation signal may be applied to a capacitor by an SMU. As mentioned, the SMU may be the similar or the same as SMU 200 described above. Similarly, the capacitor may be similar or the same as capacitor 218 described above. In some embodiments, the excitation signal may include a trapezoidal waveform. In certain embodiments, the excitation signal may be a trapezoidal waveform. In such embodiments, the excitation signal may be expressed as a series of sinusoidal waveforms, each defined by a frequency. Thus the excitation signal may have more than one frequency. In such embodiments, the operating frequency of the excitation signal may be expressed in terms of the fundamental frequency of the trapezoidal waveform. Additionally, in certain embodiments, the operating frequency of the excitation signal may be specified to maximize a signal-to-noise ratio.

Then, one or more (at least one) of a current calibration coefficient (CCC) or a voltage calibration coefficient (VCC) may be obtained. The CCC may have a corresponding current-range setting. The VCC may have a corresponding voltage-range setting. In other words, the CCC may correspond to a first current-range setting and the VCC may correspond to a first voltage-range setting.

In 304, a CCC may be obtained as illustrated in 314 and 324.

In 314, a value of a first current developed in a capacitor responsive to the excitation signal may be determined. Additionally, a value of a second current developed in the capacitor responsive to the excitation signal may be determined. Note, that the SMU may be similar to SMU 200 and may be included in a system similar to System 100. Additionally, the capacitor may be similar to capacitor 218. Further, in certain embodiments, an excitation signal which may have an amplitude may be applied to the capacitor. Note, in certain embodiments, the amplitude may include a reference voltage. In such embodiments, the first current and the second current may be developed in the capacitor responsive to the excitation signal. Additionally, in some embodiments, the SMU may be operated in a first current-range setting and a first voltage-range setting to determine the value of the first current. In such embodiments, the SMU may be operated in a second current-range setting and the first voltage-range setting to determine the value of the second current.

In 324, the CCC may be determined from the value of the first current and the value of the second current. In certain embodiments, the CCC may be a first CCC. In other words, in certain embodiments there may be one or more, or a plurality of, CCCs. In such embodiments, the method may further include obtaining a second CCC. The second CCC may correspond to a third current-range setting of the SMU. Obtaining the second CCC may include applying a second excitation signal to the capacitor. The second excitation signal may include a second operating frequency. Further, the second excitation signal may have a second amplitude. Additionally, a third current and a fourth current may be developed in the capacitor responsive to the second excitation signal. Further, a value of the third current developed in the capacitor and a value of the fourth current developed in the capacitor may be determined and the second CCC may be determined from the value of the third current and the value of the fourth current. In certain embodiments, the value of the third current may be determined by operating the SMU with the first current-range setting and the first voltage-range setting and the value of the fourth current may be determined by operating the SMU with the third current-range setting and the first voltage-range setting.

In 306, a VCC may be obtained as illustrated in 316 and 326.

In 316, a value of a first voltage developed across the capacitor responsive to the excitation signal may be determined. Additionally, a value of a second voltage developed across the capacitor responsive to the excitation signal may be determined. Note, that the SMU may be similar to SMU 200 and may be included in a system similar to System 100. Additionally, the capacitor may be similar to capacitor 218. Further, in certain embodiments, an excitation signal which may include an amplitude may be applied to the capacitor. Note, in certain embodiments, the amplitude may include a reference voltage. In such embodiments, the first voltage and the second voltage may be developed across the capacitor responsive to the excitation signal. Additionally, in some embodiments, the SMU may be operated in the first current-range setting and the first voltage-range setting to determine the value of the first voltage. In such embodiments, the SMU may be operated in the first current-range setting and a second voltage-range setting to determine the value of the second voltage.

In 326, the VCC may be determined from the value of the first voltage and the value of the second voltage. In certain embodiments, the VCC may be a first VCC. In other words, in certain embodiments there may be one or more, or a plurality of, VCCs. In such embodiments, the method may further include obtaining a second VCC. The second VCC may correspond to a third voltage-range setting of the SMU. Obtaining the second VCC may include applying a second excitation signal to the capacitor. The second excitation signal may include a second operating frequency. Further, the second excitation signal may include a second amplitude. Additionally, a third voltage and a fourth voltage may be developed across the capacitor responsive to the second excitation signal. Further, a value of the third voltage developed in the capacitor and a value of the fourth voltage developed in the capacitor may be determined and the second VCC may be determined from the value of the third voltage and the value of the fourth voltage. In certain embodiments, the value of the third voltage may be determined by operating the SMU with the first current-range setting and the first voltage-range setting and the value of the fourth voltage may be determined by operating the SMU with the first current-range setting and the third voltage-range setting.

Further, the capacitor may include an impedance and the method may further include determining the impedance of the capacitor for a specified excitation frequency. Additionally, in an exemplary embodiment, the capacitor may include a plurality of impedances based on operating frequency of the excitation signal. In such embodiments, the method may further include determining one or more impedances corresponding to one or more excitation frequencies. The method may also include weighting each of the one or more impedances to offset the corresponding apparent series loss in the circuit at each of the one or more excitation frequencies.

In certain embodiments, the capacitor may have a capacitance that is substantially constant with frequency. In other words, the capacitance may be stable, or assumed to not change, with frequency. In such embodiments, other characteristics of the capacitor may change proportionally with frequency. For example, the impedance, and more specifically the reactance of the capacitor may decrease in proportion to the operating frequency of the excitation signal. Thus, in certain embodiments, the calibration coefficients, e.g., the CCC and VCC, may be determined from the one of the reactance or capacitance of the capacitor.

Figure 4:
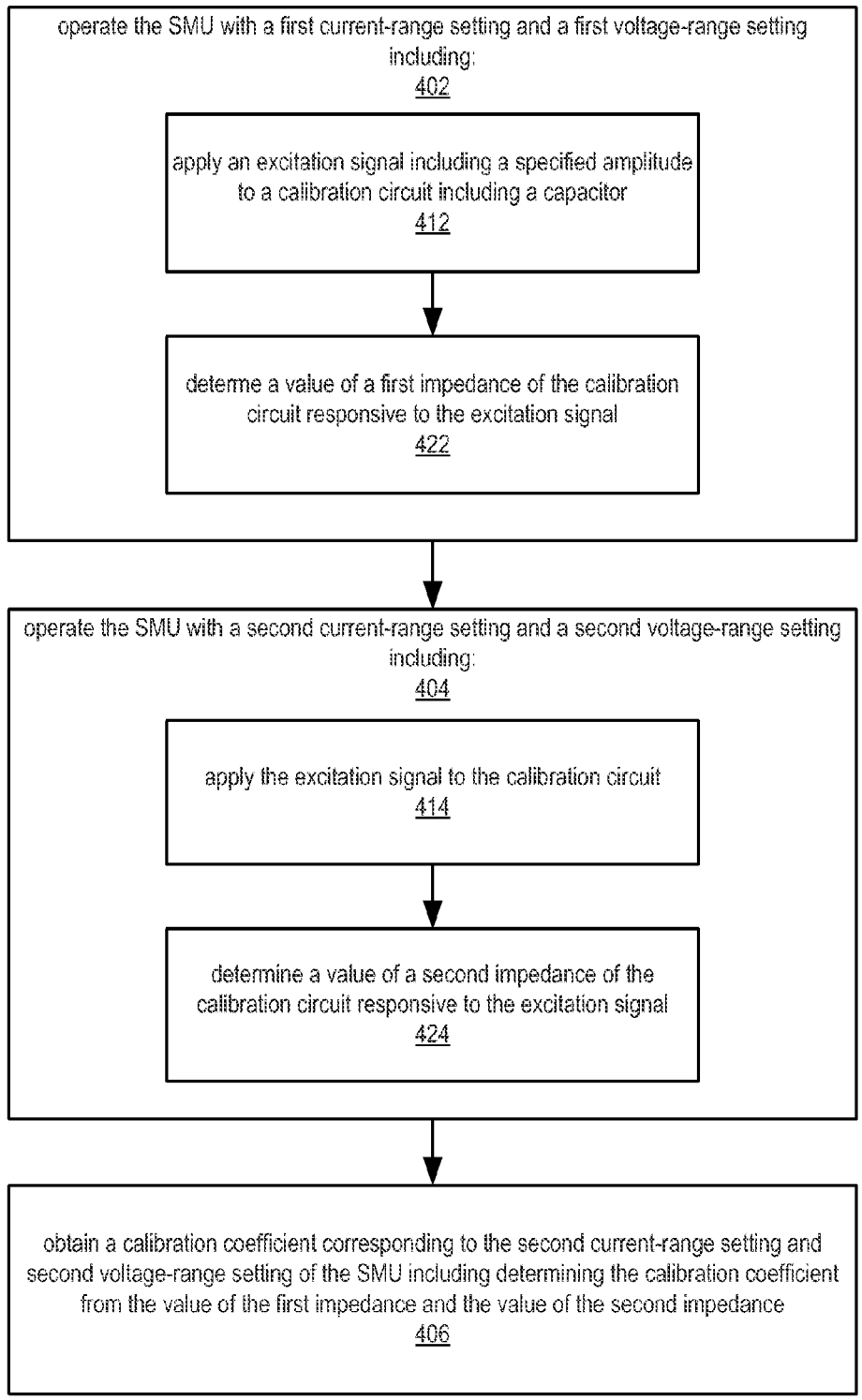
FIG. 4 is a flowchart diagram illustrating another embodiment of a method for self-calibrating an SMU.

FIG. 4—Flowchart of a Method for Calibrating and Operating an SMU

FIG. 4 illustrates another method for calibrating and operating a source-measure unit (SMU). The method shown in FIG. 4 may be used in conjunction with any of the computer systems or devices shown in the above Figures, among other devices. Further, a non-transient computer memory medium may be configured to store program instructions executable by one or more functional units to perform the method. In various embodiments, some of the method elements shown may be performed concurrently, in a different order than shown, or may be omitted. Additional method elements may also be performed as desired. As shown, this method may operate as follows.

In 402, the SMU, which may be similar to SMU 200, may be operated with a first current-range setting and first voltage-range setting.

In 412, an excitation signal which may include an amplitude may be applied to a calibration circuit including a capacitor. The capacitor may be similar to capacitor 218.

In 422, a value of a first impedance of the calibration circuit may be determined. The value of the first impedance may be responsive to the excitation signal.

In 404, the SMU may be operated with a second current-range setting and a second voltage-range setting.

In 414, the excitation signal which may include the amplitude may be applied to the calibration circuit including the capacitor.

In 424, a value of a second impedance of the calibration circuit may be determined. The value of the second impedance may be responsive to the excitation signal.

In 406, a calibration coefficient (CC) may be obtained. The CC may correspond to the second current-range setting and the second voltage-range setting of the SMU. The CC may be determined from the value of the first impedance and the value of the second impedance.

Figure 5:
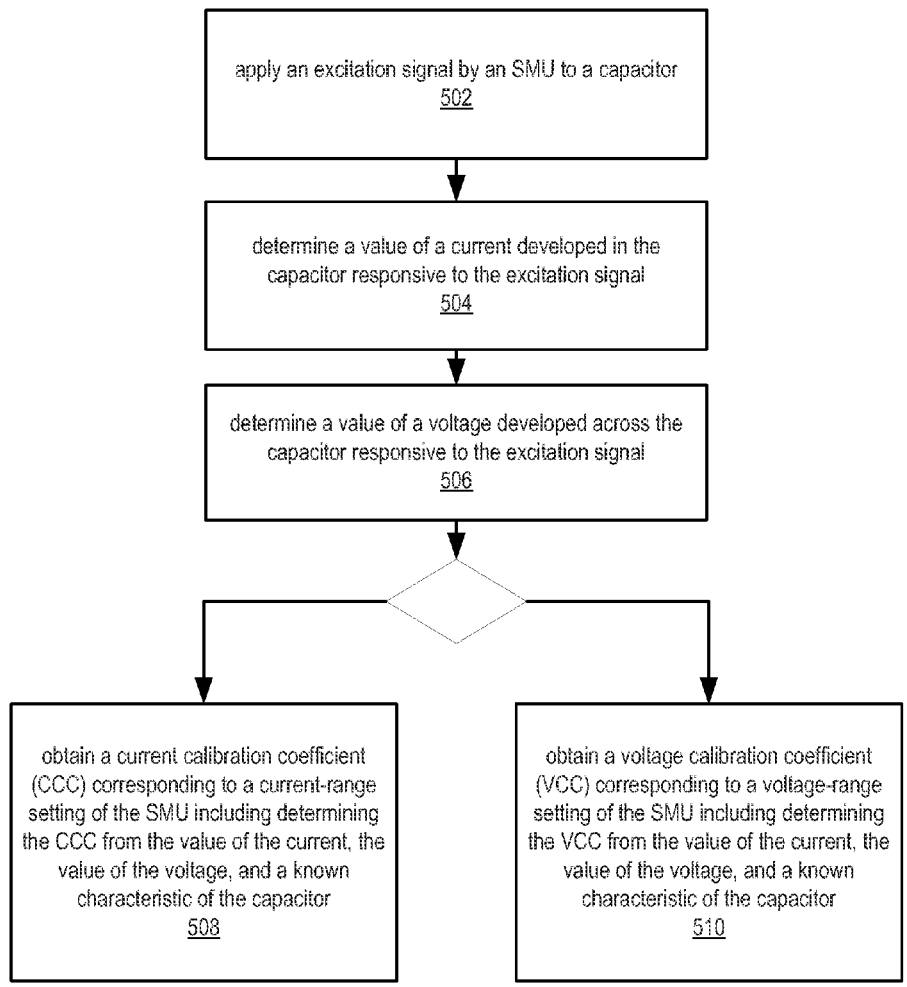
FIG. 5 is a flowchart diagram illustrating another embodiment of a method for self-calibrating an SMU.

FIG. 5—Flowchart of a Method for Calibrating and Operating an SMU

FIG. 5 illustrates another method for calibrating and operating a source-measure unit (SMU). The method shown in FIG. 5 may be used in conjunction with any of the computer systems or devices shown in the above Figures, among other devices. Further, a non-transient computer memory medium may be configured to store program instructions executable by one or more functional units to perform the method. In various embodiments, some of the method elements shown may be performed concurrently, in a different order than shown, or may be omitted. Additional method elements may also be performed as desired. As shown, this method may operate as follows.

In 502, an excitation signal may be applied to a capacitor by an SMU. As mentioned, the SMU may be the similar or the same as SMU 200 described above. Similarly, the capacitor may be similar or the same as capacitor 218 described above. In some embodiments, the excitation signal may include a trapezoidal waveform. In certain embodiments, the excitation signal may be a trapezoidal waveform. In such embodiments, the excitation signal may be expressed as a series of sinusoidal waveforms, each defined by a frequency. Thus the excitation signal may have more than one frequency. In such embodiments, the operating frequency of the excitation signal may be expressed in terms of the fundamental frequency of the trapezoidal waveform. Additionally, in certain embodiments, the operating frequency of the excitation signal may be specified to maximize a signal-to-noise ratio.

In 504, a value of a current developed in the capacitor responsive to the excitation signal may be determined.

In 506, a value of a voltage developed across the capacitor responsive to the excitation signal may be determined.

In 508 or 510, one or more of a current calibration coefficient (CCC) corresponding to a current-range setting of the SMU or a voltage calibration coefficient (VCC) corresponding to a voltage-range setting of the SMU may be obtained.

In 508, the CCC may be determined from the value of the current, the value of the voltage, and a known characteristic of the capacitor.

In 510, the VCC may be determined from the value of the current, the value of the voltage, and the known characteristic of the capacitor.

In certain embodiments, the known characteristic of the capacitor may be one of a capacitance, an impedance, or a reactance. The term known characteristic refers to a quantifiable characteristic that may be considered stable for the useful life of the capacitor. Thus, in one embodiment, the capacitor may be characterized over one or more operating frequencies. In other words, the known characteristic may change in proportion to operating frequency of an excitation signal and the known characteristic may be determined for one or more specified operating frequencies.

Figure 6A:
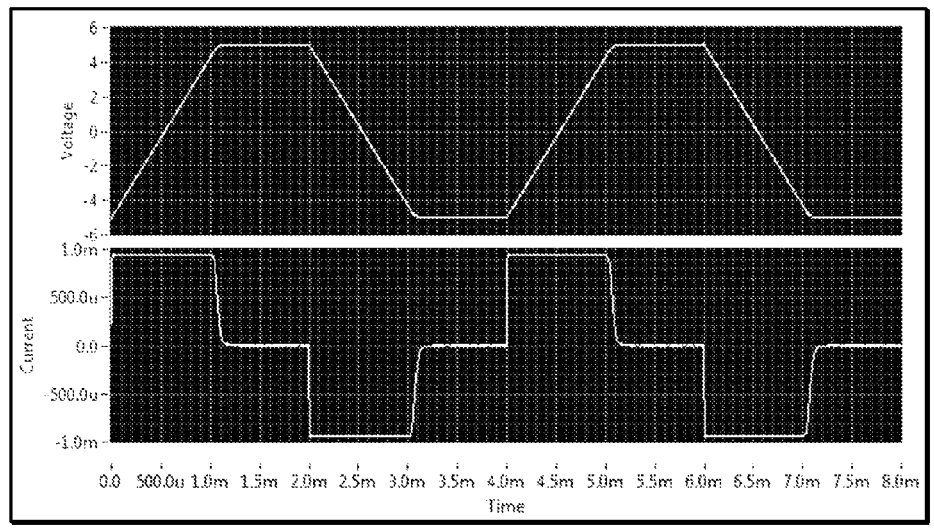
FIGS. 6A and 6B illustrate exemplary voltage and current signals responsive to an excitation signal applied to a capacitor by an SMU.
Figure 6B:
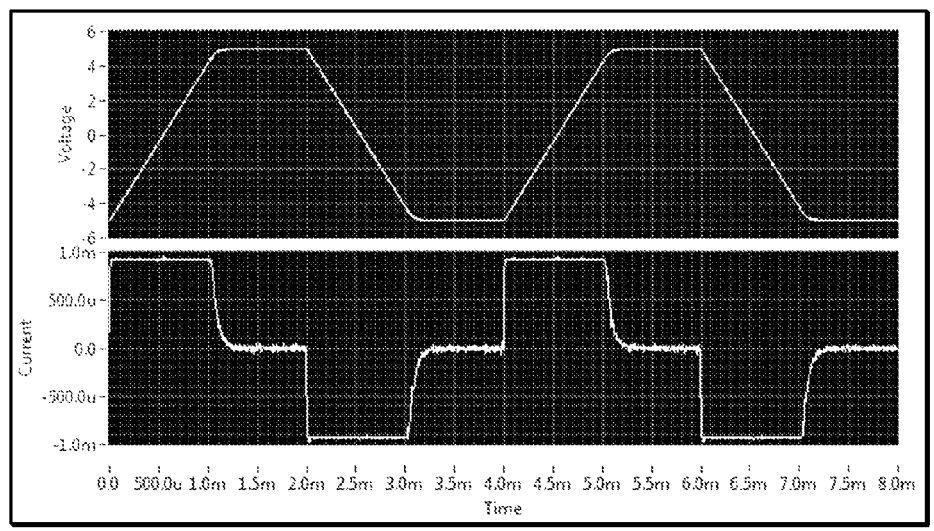

FIGS. 6A-6B—Exemplary Current and Voltage Response Signal Waveforms

FIGS. 6A and 6B illustrate exemplary voltage and current signals responsive to an excitation signal applied to a capacitor by an SMU according to one or more embodiments of the present invention. The excitation signals may be generated by an SMU as described above, such as SMU 200. The SMU may perform one or more of the methods described above, in whole or in part. Further the SMU may perform various combinations of various elements of the methods described above.

As illustrated in FIG. 6A, an SMU may be operated with a first current-range setting and a first voltage-range setting. As shown, the SMU may operate with a 6V voltage-range setting and a 1 mA current-range setting. Additionally, a trapezoidal excitation signal with a 5V magnitude may be applied with a corresponding current signal limited to 1 mA. In other words, the excitation signal may be applied to a capacitor by an SMU with the SMU operating with a first current-range setting and a first voltage-range setting. Responsive to the applied excitation signal, voltage and current waveforms as illustrated in FIG. 6A may be generated.

As illustrated in FIG. 6B, the SMU may be operated with a second current-range setting and the first voltage-range setting. As shown, the SMU may operate with a 6V voltage-range setting and a 10 mA current-range setting. Additionally, a trapezoidal excitation signal with a 5V magnitude may be applied with a corresponding current signal limited to 1 mA. In other words, the excitation signal may be applied to a capacitor by an SMU with the SMU operating with a second current-range setting and a first voltage-range setting. Responsive to the applied excitation signal, voltage and current waveforms as illustrated in FIG. 6B may be generated.

As can be seen from FIGS. 6A and 6B the waveforms are not identical. Thus, the magnitudes of the current waveforms cannot be directly compared to determine the error in the second current-range setting, e.g., the 10 mA range. In order to compare the current waveforms, the magnitudes of the voltages may be scaled.

One method to scale the voltages may be to compare the impedances computed from the magnitudes of the current and voltage. In other words, compare a value of the current to the value of the voltage. In one embodiment, the magnitudes may be determined from the standard deviations of the voltage and current measurements. Assuming the first current-range setting, e.g., the 1 mA range is previously calibrated, then the degree of mis-calibration of the second current-range setting, e.g., the 10 mA range, may be determined from the ratio of the impedances. Note that, in embodiments where the determined value of the voltages are equal, the degree of mis-calibration may be determined by comparing the determined values of the current.

Additionally, in embodiments in which the excitation signal has a trapezoidal waveform, the excitation signal may have components at multiple frequencies. In such embodiments, the resulting impedance may be a weighted impedance over multiple frequencies. Note further, that in certain embodiments, the weighting may change from one current-range setting to another due to frequency response changes. Thus, in certain embodiments, the impedance of the capacitor at fundamental frequency of the excitation signal may be determined by performing an FFT on both the current and voltage waveforms. Then, the complex values representing the fundamental frequency of each voltage and current may be used to determine impedances. Additionally, the reactance may be determined. In certain embodiments, the reactance may be used to determine the mis-calibration.

In certain embodiments, it may be necessary to correct for inductance which may be in series with the capacitor. The inductance may be real, such as interconnect inductance, or virtual, such as an artifact of the frequency response of the signal path. Similar to capacitance, inductance may contribute to the imaginary term of the impedance. Further, if the inductance changes with current-range settings of the SMU, then the inductance may introduce error in the computations described above. However, since an inductance change may be distinguished from a capacitance change over a range of frequencies, the capacitance may be calculated at other frequencies of the excitation signal, such as, for example, the third and fifth harmonic of the excitation signal. Note, it is envisioned that other harmonics may be used.

It should further be noted that the various terms or designations for circuits/components and signals as they appear herein, for example in such expressions as "driver circuit", "delay circuit", "data signal", "control signal", "first current", "second voltage", "first characteristic", etc. are merely names or identifiers used to distinguish among the different circuits/components and/or between different signals, currents, voltages, etc., and these identifying terms are not intended to connote any specific meaning, unless explicitly noted otherwise.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A method for calibrating and operating a source-measure unit (SMU), the method comprising:
    applying an excitation signal by the SMU to a capacitor;
    obtaining one or more of:
        a current calibration coefficient (CCC) corresponding to a current-range setting of the SMU, said obtaining the CCC comprising:
            determining a value of a first current developed in the capacitor responsive to the excitation signal and determining a value of a second current developed in the capacitor responsive to the excitation signal; and
            determining the CCC from the value of the first current and the value of the second current; or
        a voltage calibration coefficient (VCC) corresponding to a voltage-range setting of the SMU, said obtaining the VCC comprising:
            determining a value of a first voltage developed across the capacitor responsive to the excitation signal and determining a value of a second voltage developed across the capacitor responsive to the excitation signal; and
            determining the VCC from the value of the first voltage and the value of the second voltage;
    performing a measurement, by the SMU, on a device under test; and
    correcting an error in the measurement, using one or more of:
        the obtained CCC; or
        the obtained VCC.

2. The method of claim 1;
    wherein when obtaining the CCC:
        said obtaining the CCC further comprises determining a value of a third voltage developed across the capacitor corresponding to the value of the first current and a value of a fourth voltage developed across the capacitor corresponding to the value of the second current; and
        said determining the CCC further comprises determining the CCC from the ratio of value of the first current to the value of third voltage and the ratio of the value of the second current to the value of the fourth voltage; and
    wherein when obtaining the VCC:
        said obtaining the VCC further comprises determining a value of a third current developed in the capacitor corresponding to the value of the first voltage and a value of a fourth current developed in the capacitor corresponding to the value of the fourth current; and said determining the VCC further comprises determining the VCC from the ratio of value of the third current to the value of first voltage and the ratio of the value of the fourth current to the value of the second voltage.

3. The method of claim 1;
wherein when obtaining the CCC, said determining the CCC further comprises determining the CCC based on a first characteristic of the capacitor corresponding to the value of the first current and a second characteristic of the capacitor corresponding to the value of the second current; and
wherein when obtaining the VCC, said determining the VCC further comprises determining the VCC based on a third characteristic of the capacitor corresponding to the value of the first voltage and a fourth characteristic of the capacitor corresponding to the value of the second voltage.

4. The method of claim 3, wherein the characteristic of the capacitor includes one of:
an impedance;
a reactance; or
a capacitance.

5. The method of claim 1;
wherein the excitation may have an amplitude and an operating frequency;
wherein when obtaining the CCC said determining the CCC further comprises determining the CCC based on a known characteristic of the capacitor and the value of the first and second currents, wherein the known characteristic of the capacitor is based on the operating frequency of the excitation signal; and
wherein when obtaining the VCC said determining the VCC further comprises determining the VCC based on the known characteristic of the capacitor and the value of the first and second voltages.

6. The method of claim 5;
wherein the known characteristic is one of:
an impedance;
a reactance; or
a capacitance; and
wherein the method further comprises determining the known characteristic of the capacitor for a specified excitation signal, wherein the specified excitation signal has an operating frequency.

7. The method of claim 1;
wherein said determining the value of the first current and said determining the value of the first voltage each comprises operating the SMU with a first current-range setting and a first voltage-range setting;
wherein said determining the value of the second current comprises operating the SMU with a second current-range setting and the first voltage-range setting;
wherein the CCC corresponds to the second current-range setting; and
wherein said determining the value of the second voltage comprises operating the SMU with the first current-range setting and a second voltage-range setting; and
wherein the VCC corresponds to the second voltage-range setting.

8. The method of claim 1;
wherein the excitation signal comprises a trapezoidal waveform.

9. The method of claim 1;
wherein the amplitude and operating frequency of the excitation signal are specified to maximize a signal-to-noise ratio.

10. The method of claim 1;
wherein the excitation signal is a first excitation signal having a first operating frequency, wherein the CCC is a first CCC, wherein the VCC is a first VCC, and wherein the method further comprises:
obtaining one or more of:
  a second CCC corresponding to a third current-range setting of the SMU, said obtaining the second CCC comprising:
    applying a second excitation signal to the capacitor comprising a second operating frequency, wherein a third current and a fourth current are developed in the capacitor responsive to the second excitation signal;
    determining a value of the third current developed in the capacitor and a value of the fourth current developed in the capacitor; and
    determining the second CCC from the value of the third current and the value of the fourth current; or
  a second VCC corresponding to a third voltage-range setting of the SMU, said obtaining the second VCC comprising:
    applying the second excitation signal to the capacitor, wherein a third voltage and a fourth voltage are developed across the capacitor responsive to the second excitation signal;
    determining a value of the third voltage developed across the capacitor and a value of the fourth voltage developed across the capacitor; and
    determining the second VCC from the value of the third voltage and the value of the fourth voltage.

11. The method of claim 10;
wherein said determining the value of the third current and said determining the value of the third voltage each comprises operating the SMU with the first current-range setting and the first voltage-range setting;
wherein said determining the value of the fourth current comprises operating the SMU with the third current-range setting and the first voltage-range setting; and
wherein said determining the value of the fourth voltage comprises operating the SMU with the first current-range setting and the third voltage-range setting.

12. The method of claim 10;
wherein the second excitation signal has a second amplitude.

13. The method of claim 1;
wherein the capacitor has one or more impedances corresponding to one or more frequencies of the excitation signal, the method further comprising:
weighting each of the one or more impedances to offset a corresponding one or more apparent series losses in the circuit, wherein the one or more apparent series losses are a function of the one or more frequencies of the excitation signal.

14. A source-measure unit (SMU) comprising:
a functional unit; and
output terminals, selectively coupled to the functional unit; and
wherein the functional unit is configured to:
  obtain one or more of:
    a current calibration coefficient (CCC) corresponding to a current-range setting of a source-measure unit (SMU), wherein to obtain the CCC the functional unit is configured to:
      determine a value of a first current developed in a capacitor responsive to an excitation signal applied by the SMU to the capacitor and determine a value of a second current developed in the capacitor responsive to the excitation signal; and determine the CCC from the value of the first current and the value of the second current; or a voltage calibration coefficient (VCC) corresponding to a voltage-range setting of the SMU, wherein to obtain the VCC the functional unit is configured to:

determine a value of a first voltage developed across the capacitor responsive to an excitation signal and determine a value of a second voltage developed across the capacitor responsive to the excitation signal; and determine the VCC from the value of the first voltage and the value of the second voltage;

perform a measurement on a device under test; and correct an error in the measurement, using one or more of:
the obtained CCC; or
the obtained VCC.

15. The SMU of claim 14,
wherein when obtaining the CCC:
the functional unit is further configured to determine a value of a third voltage developed across the capacitor corresponding to the value of the first current and a value of a fourth voltage developed across the capacitor corresponding to the value of the second current; and
wherein to determine the CCC, the functional unit is further configured to determine the CCC from the ratio of value of the first current to the value of third voltage and the ratio of the value of the second current to the value of the fourth voltage; and
wherein when obtaining the VCC:
the functional unit is further configured to determine a value of a third current developed in the capacitor corresponding to the value of the first voltage and a value of a fourth current developed in the capacitor corresponding to the value of the fourth current; and
wherein to determine the VCC, the functional unit is further configured to determine the VCC from the ratio of value of the third current to the value of first voltage and the ratio of the value of the fourth current to the value of the second voltage.

16. The SMU of claim 14,
wherein when obtaining the CCC, the functional unit is further configured to determine the CCC based on a first characteristic of the capacitor corresponding to the value of the first current and a second characteristic of the capacitor corresponding to the value of the second current; and
wherein when obtaining the VCC, the functional unit is further configured to determine the VCC based on a third characteristic of the capacitor corresponding to the value of the first voltage and a fourth characteristic of the capacitor corresponding to the value of the second voltage.

17. The SMU of claim 16,
wherein the characteristic of the capacitor includes one of:
an impedance;
a reactance; or
a capacitance.

18. The SMU of claim 14,
wherein the excitation signal may have an amplitude and an operating frequency;
wherein when obtaining the CCC, the functional unit is further configured to determine based on a known characteristic of the capacitor and the value of the first and second currents, wherein the known characteristic of the capacitor is based on the operating frequency of the excitation signal; and
wherein when obtaining the VCC, the functional unit is further configured to determine the VCC based on the known characteristic of the capacitor and the value of the first and second voltages.

19. The SMU of claim 14, wherein the amplitude and operating frequency of the excitation signal are specified to maximize a signal-to-noise ratio.

20. A non-transitory computer readable memory medium storing program instructions executable by a processor to:
obtain one or more of:
a current calibration coefficient (CCC) corresponding to a current-range setting of a source-measure unit (SMU), wherein to obtain the CCC the functional unit is configured to:
determine a value of a first current developed in a capacitor responsive to an excitation signal applied by the SMU to the capacitor and a value of a second current developed in the capacitor responsive to the excitation signal; and
determine the CCC from the value of the first current and the value of the second current; or
a voltage calibration coefficient (VCC) corresponding to a voltage-range setting of the SMU, wherein to obtain the VCC the functional unit is configured to:
determine a value of a first voltage developed across the capacitor responsive to an excitation signal and a value of a second voltage developed across the capacitor responsive to the excitation signal; and
determine the VCC from the value of the first voltage and the value of the second voltage;
cause the SMU to perform a measurement on a device under test; and
correct an error in the measurement, using one or more of:
the obtained CCC; or
the obtained VCC.

* * * * *